(12) United States Patent
Shin et al.

(10) Patent No.: US 11,195,696 B2
(45) Date of Patent: Dec. 7, 2021

(54) ELECTRON BEAM GENERATOR, PLASMA PROCESSING APPARATUS HAVING THE SAME AND PLASMA PROCESSING METHOD USING THE SAME

(71) Applicant: SAMSUNG ELECTRONICS CO., LTD., Suwon-si (KR)

(72) Inventors: Dongkyu Shin, Seoul (KR); Sangki Nam, Seongnam-si (KR); Soonam Park, Seongnam-si (KR); Akira Koshiishi, Hwaseong-si (KR); Kyuhee Han, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/850,252

(22) Filed: Apr. 16, 2020

(65) Prior Publication Data

US 2021/0110997 A1 Apr. 15, 2021

(30) Foreign Application Priority Data

Oct. 10, 2019 (KR) .................. 10-2019-0125569

(51) Int. Cl.
*H01J 37/32* (2006.01)
*H01L 21/67* (2006.01)
(Continued)

(52) U.S. Cl.
CPC ...... *H01J 37/32009* (2013.01); *H01J 37/063* (2013.01); *H01J 37/3244* (2013.01);
(Continued)

(58) Field of Classification Search
CPC .......... H01L 21/6831; H01L 21/67069; H01L 21/3065; H01J 37/3244; H01J 37/32009;
(Continued)

(56) References Cited

U.S. PATENT DOCUMENTS 4,987,346 A * 1/1991 Kalzschner ............. H01J 37/08
315/111.41
5,639,308 A 6/1997 Yamazaki et al.
(Continued)

OTHER PUBLICATIONS

Boris et al., Spatial Profile of Density in Electron Beam Generated Plasmas, Plasma Physics Division, Naval Research Laboratory, Feb. 2014.
(Continued)

*Primary Examiner* — Yuechuan Yu
(74) *Attorney, Agent, or Firm* — Lee IP Law, P.C.

(57) ABSTRACT

An electron beam generator, a plasma processing apparatus, and a plasma processing method, the electron beam generator including a side insulator configured to surround the substrate support, the side insulator having an electron beam chamber therein; a first electrode embedded in the side insulator and adjacent to a first side wall of the electron beam chamber; a second electrode on a second side wall of the electron beam chamber; and a guide in an outlet of the electron beam chamber, the guide including slits through which electron beams generated in the electron beam chamber are transmittable into the process chamber.

17 Claims, 8 Drawing Sheets

(51) Int. Cl.
    *H01L 21/683*     (2006.01)
    *H01L 21/3065*     (2006.01)
    *H01J 37/063*     (2006.01)

(52) U.S. Cl.
    CPC .... *H01J 37/32715* (2013.01); *H01L 21/3065* (2013.01); *H01L 21/67069* (2013.01); *H01L 21/6831* (2013.01); *H01J 2237/0473* (2013.01)

(58) Field of Classification Search
    CPC ............... H01J 37/32715; H01J 37/063; H01J 2237/0473
    See application file for complete search history.

(56) References Cited

U.S. PATENT DOCUMENTS

| | | | |
|---|---|---|---|
| 7,829,469 B2 | 11/2010 | Chen et al. | |
| 8,574,445 B2 | 11/2013 | Cho et al. | |
| 8,765,234 B2 | 7/2014 | Rogers | |
| 9,111,728 B2 | 8/2015 | Holland et al. | |
| 9,362,131 B2 | 6/2016 | Agarwal et al. | |
| 9,564,297 B2 | 2/2017 | Wu et al. | |
| 9,799,491 B2 | 10/2017 | Dorf et al. | |
| 10,347,468 B2 | 7/2019 | Lee et al. | |
| 2003/0046976 A1* | 3/2003 | Hanazaki | G01N 33/0011 73/23.21 |
| 2012/0258601 A1* | 10/2012 | Holland | H01J 37/04 438/729 |
| 2013/0098872 A1 | 4/2013 | Dorf et al. | |
| 2015/0167171 A1* | 6/2015 | Hasebe | C23C 16/511 427/575 |
| 2017/0140900 A1* | 5/2017 | Dorf | H01J 37/32357 |

OTHER PUBLICATIONS

Boris et al., Atomic Fluorine Densities in Electron Beam Generated Plasmas, U.S. Naval Research Laboratory, Plasma Physics Division.
Lock et al., J. Phys. D Appl. Phys., 47, 425206 (2014).
Lock et al., Plasma Sources Sci. Technol., 17, 025009 (2008).
Walton et al., ECS Journal of Solid State Science and Tech., 4 (6), N5033-N5040 (2015).

* cited by examiner

ELECTRON BEAM GENERATOR, PLASMA PROCESSING APPARATUS HAVING THE SAME AND PLASMA PROCESSING METHOD USING THE SAME

CROSS-REFERENCE TO RELATED APPLICATION

Korean Patent Application No. 10-2019-0125569, filed on Oct. 10, 2019, in the Korean Intellectual Property Office, and entitled: "Electron Beam Generator, Plasma Processing Apparatus Having the Same, and Plasma Processing Method Using the Same," is incorporated by reference herein in its entirety.

BACKGROUND

1. Field

Embodiments relate to an electron beam generator, a plasma processing apparatus having the same, and a plasma processing method using the same.

2. Description of the Related Art

Many types of semiconductor devices may be manufactured using plasma-based etching techniques. For example, a plasma etching apparatus may generate plasma within a chamber to perform an etching process.

SUMMARY

The embodiments may be realized by providing an electron beam generator for a plasma processing apparatus that includes a substrate support within a process chamber, the electron beam generator including a side insulator configured to surround the substrate support, the side insulator having an electron beam chamber therein; a first electrode embedded in the side insulator and adjacent to a first side wall of the electron beam chamber; a second electrode on a second side wall of the electron beam chamber; and a guide in an outlet of the electron beam chamber, the guide including slits through which electron beams generated in the electron beam chamber are transmittable into the process chamber.

The embodiments may be realized by providing a plasma processing apparatus including a process chamber providing a space for processing a substrate; a substrate support configured to support the substrate within the process chamber; a shower head within the process chamber to face the substrate, the shower head being configured to supply a gas toward the substrate; a plasma generator configured to convert the gas into plasma over the substrate support; and an electron beam supply outside the substrate support and configured to inject an electron beam to a region of the plasma, wherein the electron beam supply includes a side insulator outside the substrate support and having an electron beam chamber therein; a first electrode embedded in the side insulator and adjacent to a first side wall of the electron beam chamber; a second electrode on a second side wall of the electron beam chamber; and a guide in an outlet of the electron beam chamber, the guide including slits through which electron beams generated in the electron beam chamber are transmittable into the chamber.

The embodiments may be realized by providing a plasma processing method including loading a substrate on a substrate support within a process chamber; introducing a gas into the process chamber through a shower head that is arranged to face the substrate support; converting the gas into a first plasma over the substrate support; injecting an electron beam to a region of the first plasma to generate a second plasma; and performing a plasma process on the substrate using the second plasma.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
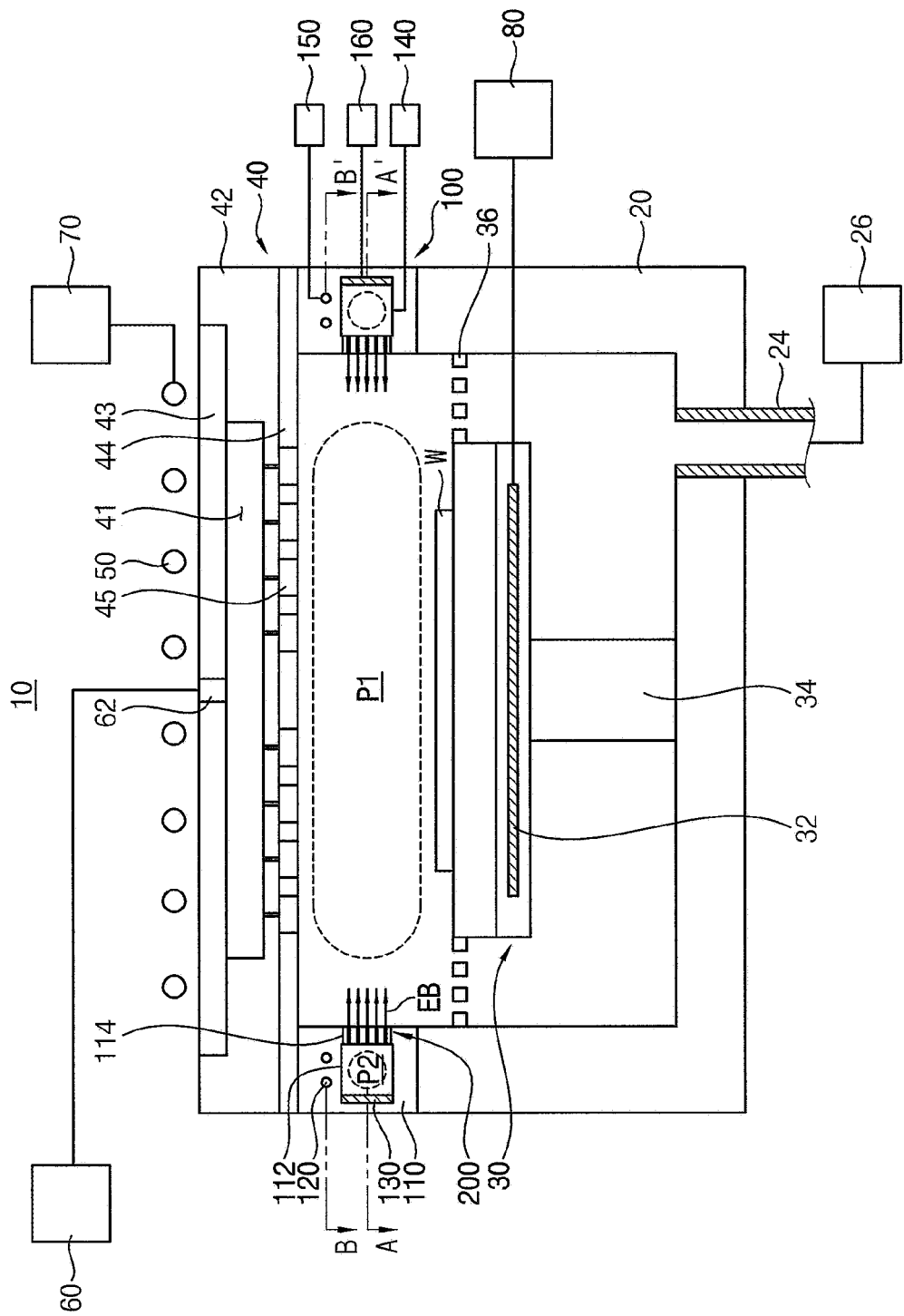
FIG. 1 illustrates a diagram of a plasma processing apparatus in accordance with example embodiments.
Figure 2:
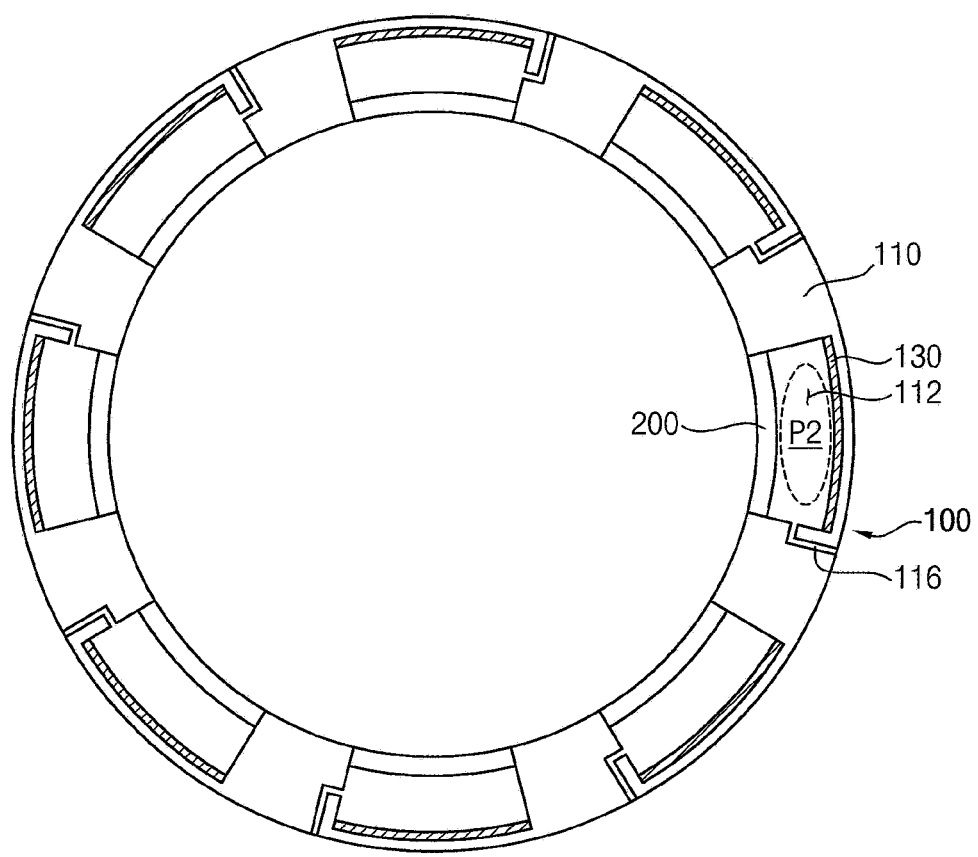
FIG. 2 illustrates a cross-sectional view taken along the line A-A' of FIG. 1.
Figure 3:
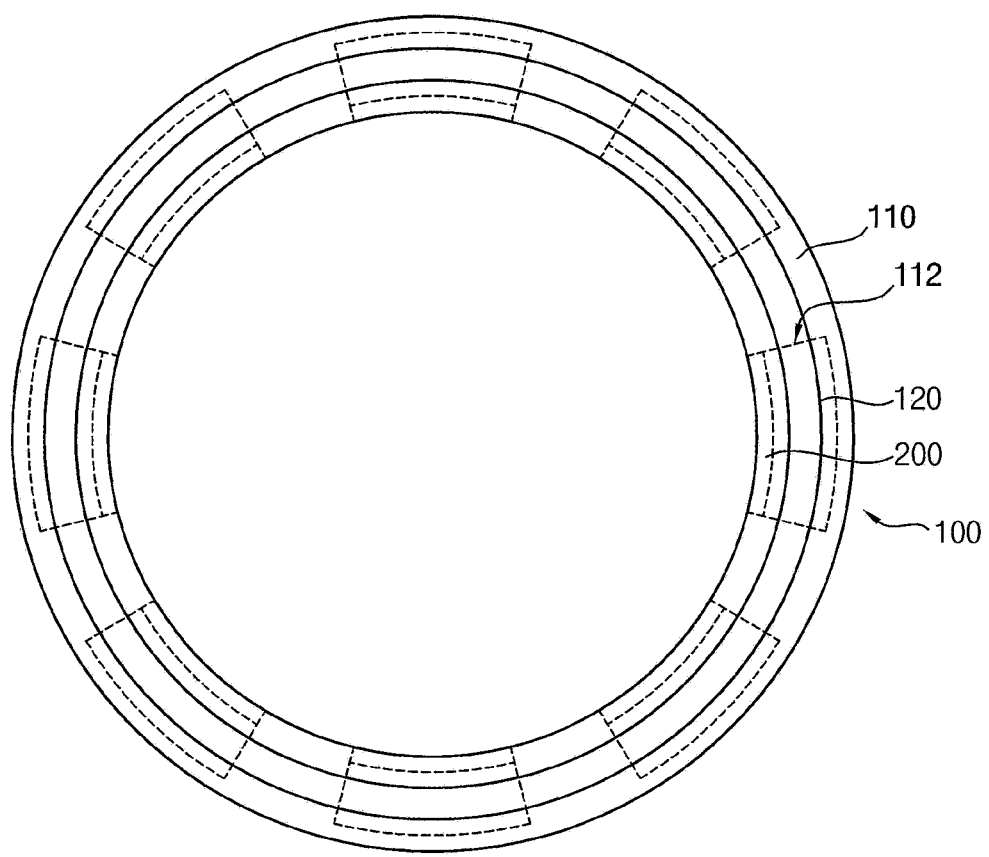
FIG. 3 illustrates a cross-sectional view taken along the line B-B' of FIG. 1.
Figure 4:
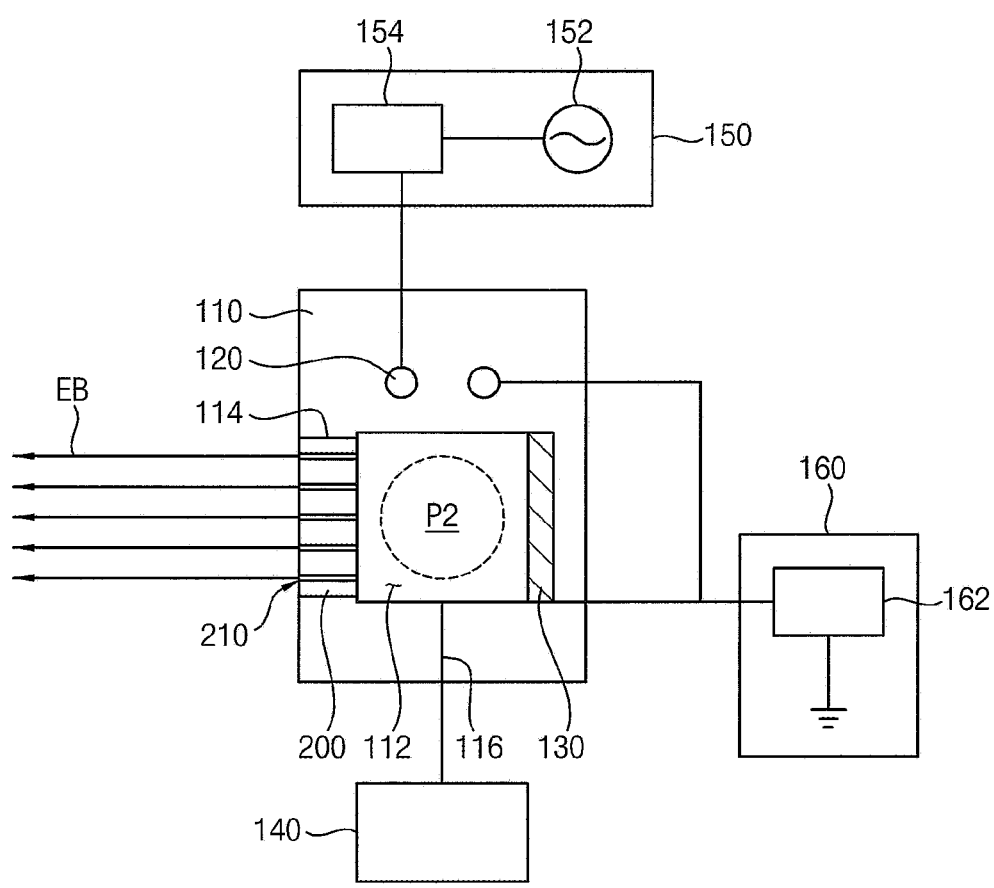
FIG. 4 illustrates a diagram of an electron beam generator of the plasma processing apparatus of FIG. 1.

FIG. 1 illustrates a diagram of a plasma processing apparatus in accordance with example embodiments. FIG. 2 illustrates a cross-sectional view taken along the line A-A' of FIG. 1. FIG. 3 illustrates a cross-sectional view taken along the line B-B' of FIG. 1. FIG. 4 illustrates a diagram of an electron beam generator of the plasma processing apparatus of FIG. 1.

Referring to FIGS. 1 to 4, a plasma processing apparatus 10 may include a chamber 20 (e.g., a process chamber), a substrate support 30, a shower head 40, a plasma generator, and an electron beam supply 100. The plasma generator may include an upper electrode 50. In an implementation, the plasma processing apparatus 10 may further include a gas supply, an exhauster 26, or the like.

In an implementation, the plasma processing apparatus 10 may be configured to etch a layer on the substrate (e.g., a wafer W) within the induced coupled plasma (ICP) chamber. In an implementation, the plasma generated by the plasma processing apparatus may be, e.g., capacitively coupled plasma, microwave plasma, or the like. In an implementation, the plasma processing apparatus may be, e.g., a deposition apparatus, a cleaning apparatus, or the like. In an implementation, the substrate may include a semiconductor substrate, a glass substrate, or the like.

The chamber 20 may provide a sealed space where a plasma etching process is performed on the wafer W. The chamber 20 may be, e.g., a cylindrical shaped vacuum chamber. The chamber 20 may include (e.g., may be formed of), e.g., a metal such as aluminum, stainless steel, or the like.

The substrate support 30 may be arranged within the chamber 20 to support the substrate. For example, the substrate support 30 may serve as a susceptor for supporting the wafer W thereon. In an implementation, the substrate support 30 may include a support plate having an electrostatic chuck for holding the wafer W using electrostatic force. The wafer W may be adsorptively held on the electrostatic chuck when a direct current is applied thereto by a DC power source through an ON-OFF switch.

The substrate support 30 may include a circular plate-shaped lower electrode 32 under the support plate. The substrate support 30 may be installed to be movable upwardly and downwardly by a driver 34. The substrate support 30 may include a focus ring along a circumference of the support plate to support a peripheral region of the wafer W. The focus ring may have a ring shape.

In an implementation, a heater, a plurality of fluid lines, or the like may be installed in the substrate support 30. The heater may be electrically connected to a power source to heat the wafer W through the support plate. The heater may include a coil having a spiral shape. The fluid line may be provided as a cooling channel through which a heat transfer gas or fluid circulates. The fluid line may be installed in the support plate to have a spiral shape.

The exhauster 26 may be connected to an exhaust port 24 in a bottom portion of the chamber 20. The exhauster 26 may include a vacuum pump such as a turbo-molecular pump or the like, to control a pressure of the chamber 20 so that the processing space inside the chamber 20 may be depressurized to a desired vacuum level. In an implementation, process by-products and residual process gases may be discharged or removed through the exhaust port 24.

Additionally, the plasma processing apparatus 10 may further include a baffle 36. The baffle 36 may be arranged outside or around an outer circumference surface of the substrate support 30. The baffle 36 may include a conductive material. The baffle 36 may have a conductive ring having an inner diameter and an outer diameter. The baffle 36 may include an annular-shaped plate that is arranged to extend parallel with an upper surface of the substrate support 30. The baffle 36 may be electrically connected to the substrate support 30, so that the baffle 36 may be electrically grounded during the plasma processing process. The baffle 36 may help remove electrons from the plasma to increase ion energy during the process, thereby improving etching uniformity.

The baffle 36 may include a plurality of perforations that allow a gas to flow therethrough. Process by-products and residual process gases generated within the chamber 20 may be discharged through the exhaust port 24 via the perforations of the baffle 36.

A gate for opening and closing a loading/unloading port of the wafer W may be provided in a side wall of the chamber 20. The wafer W may be loaded/unloaded onto/from the substrate stage through the gate.

In an implementation, the shower head 40 may constitute at least a portion of a vacuum lid assembly which covers an opening in an upper portion of the chamber 20. The shower head 40 may be arranged in the upper portion of the chamber 20. The shower head 40 may be over the substrate support 30 such that the show head faces the lower electrode 32. The shower head 40 may spray out a gas toward the substrate.

The shower head 40 may include a shower head plate 42 having an annular shape, an upper cover 43 on the shower head plate 42 to form a gas diffusion room 41, and a manifold 44 under the shower head plate 42 and having injection holes 45 formed therein. The manifold 44 may be installed detachably on a lower surface of the shower head plate 42. The injection holes 45 may be connected to the gas diffusion room 41. The gas diffusion room 41 may be provided as a remote plasma region for generating plasma and supply reactive constituents of the plasma to the space over the substrate support 30.

The upper electrode 50 may be outside the chamber 20 such that the upper electrode 50 faces the lower electrode 32. The upper electrode 50 may be on the upper cover 43 of the shower head 40. The upper electrode 50 may include a radio frequency antenna. The radio frequency antenna may have a plan coil shape. An electromagnetic field induced by the upper electrode 50 may be applied to a process gas introduced into the chamber 20 to generate plasma.

The shower head 40 may include a dielectric material. For example, the shower head 40 may include alumina ($Al_2O_3$). An RF from the upper electrode 50 may be transferred into the chamber 20 through the shower head 40. The shower head 40 may serve as a dielectric window of the ICP chamber. For example, the upper cover 43 may include a circular plate shaped dielectric window. For example, the dielectric window may include alumina ($Al_2O_3$). The power from the antenna may be transferred into the chamber 20 through the dielectric window.

The gas supply may include a gas supply line 62, a flow controller, and a gas supply source 60, such as gas supply elements. The gas supply line 62 may be connected to the gas diffusion room 41 of the shower head 40, and the flow controller may control an amount of the gas supplied into the chamber 20 through the gas supply line 62. For example, the gas supply source 60 may include a plurality of gas tanks, and the flow controller may include a plurality of mass flow controllers (MFCs) corresponding to the gas tanks. The mass flow controllers may independently control the supply amounts of the gases respectively.

In an implementation, the gas supply may include a remote plasma source that generates ion, atoms, radicals, and different plasma species. The plasma species may be supplied into the chamber 20 through the shower head 40 from the gas supply. The remote plasma source may generate plasma species, e.g., radicals, ions, atoms, or the like, from a supplied plasma source. The remote plasma source may be a plasma source type such as microwave, electron cyclotron resonance upstream plasma source, or the like.

A portion or space of the chamber between the upper electrode 50 and the lower electrode 32, e.g., between the shower head 40 and the substrate support 30, may be a first plasma generation region P1.

In an implementation, the plasma generator may include a plasma power supply 70 configured to apply a plasma source power to the upper electrode 50. For example, the plasma power supply 70 may include a source RF power source and a source RF matcher, such as plasma source elements. The source RF power source may generate a radio frequency (RF) signal. The source RF matcher may match impedance of the RF signal generated by the source RF power source using the coils to control generation of plasma.

In an implementation, the plasma processing apparatus 10 may include a bias power supply configured to apply a bias source power to the lower electrode 32. The bias power supply may include a bias RF power source and a bias RF matcher, such as bias elements. The lower electrode 32 may attract plasma atoms or ions generated within the chamber 20. The bias RF power source may generate a radio frequency (RF) signal. The bias RF matcher may match impedance of the bias RF signal by controlling bias voltage and bias current applied to the lower electrode 32. The bias RF power source and the source RF power source may be synchronized or desynchronized each other through a synchronizer of a controller.

The controller may be connected to the plasma power supply and the bias power supply and control operations thereof. The controller having a microcomputer and various interface circuits may control an operation of the plasma processing apparatus based on programs and recipe information stored in an external or internal memory.

The plasma power supply may apply a radio frequency signal to the upper electrode 50 in response to a plasma power control signal from the controller. For example, the radio frequency power may be generated to have a frequency range of about 27 MHz to about 2.45 GHz and a RF power range of about 100 W to about 1,000 W. For example, the radio frequency power may be generated to have a frequency of about a 40 MHz to about 1.5 GHz.

As the radio frequency power having a predetermined frequency (e.g., 13.56 MHz) is applied to the upper electrode 50, an electromagnetic field induced by the upper electrode 50 may be applied to a source gas supplied within the chamber 20 to generate a first plasma.

In an implementation, the electron beam supply 100 as an electron beam generator may generate an electron beam and irradiate the generated electron beam EB to the first plasma generation region P1 over the substrate support 30. The electron beam supply 100 may include a first electrode 120 configured to transfer a power to a process gas within an electron beam chamber 112 to generate the electron beam, a second electrode 130 configured to transmit the generated electron beam through an outlet 114, and a guide 200 installed in the outlet 114 and having slits 210 therein to guide the electron beam therethrough.

The electron beam supply 100 may be installed inside an upper side wall of the chamber 20 or on an inner surface of the upper side wall. The electron beam supply 100 may constitute at least a portion of the upper side wall of the chamber 20. The electron beam supply 100 and the shower head 40 may constitute at least a portion of the vacuum lid assembly covering the opening in the upper portion of the chamber 20.

The electron beam supply 100 may be positioned outside the circumference of the substrate support 30. The electron beam supply 100 may be positioned higher than the substrate support 30 (e.g., between the substrate support 30 and the shower head 40 relative to a vertical direction). A plurality of electron beam supplies 100 may be arranged along the circumference of the substrate support 30 to be spaced apart from each other.

The electron beam supply 100 may be installed in a side insulator 110 in or at the upper side wall of the chamber 20. The side insulator 110 may have an annular shape (e.g., may have a hollow or open central region) extending along or around a circumferential direction about a center of the chamber 20. The side insulator 110 may include an insulation material, e.g., a ceramic. In an implementation, the side insulator 110 may include, e.g., silica ($SiO_2$), alumina ($Al_2O_3$), yttrium fluoride ($YF_3$), yttria ($Y_2O_3$), silicon carbide (SiC), or the like.

The side insulator 110 may be combined or coupled with a lower (e.g., facing) portion of the shower head to constitute at least a portion of the vacuum lid assembly. The side insulator 110 may be installed detachably on the lower portion of the shower head 40.

The side insulator 110 may include the electron beam chamber 112. A plurality of the electron beam chambers 112 may be arranged along the extending direction (e.g., the circumferential direction) of the side insulator 110 to be spaced apart from each other. The electron beam chamber 112 may provide a second plasma generation region P2 where the electron beam is generated. The electron beam chamber 112 may have the outlet 114 which is open toward a center of the chamber 20, e.g., toward the substrate support 30.

The first electrode 120 may be embedded in the side insulator 110. The first electrode 120 may include at least portions of coils in the side insulator 110 and extending along the extending direction respectively. For example, coils of the first electrode 120 may extend in a same direction (e.g., circumferential direction) as an extending direction of the side insulator 110). In an implementation, first electrode 120 may be adjacent to a first side wall, e.g., upper wall, of the electron beam chamber 112 (e.g., a side wall of the electron beam chamber 112 that faces the shower head 40). The first electrode 120 may be spaced from an inner wall of the electron beam chamber 112. The first electrode 120 including the coil may generate plasma having high electron density. The electron beam having desired electron density may be extracted from the plasma.

A first power supply 150 may supply a plasma source power to the first electrode 120. The first power supply 150 may include an RF power source 152 and an RF matcher 154. The RF matcher 154 may include a matching circuit that provides impedance matching in order to minimize reflection of the RF power applied to the first electrode 120.

The second electrode 130 may be on an inner surface of the electron beam chamber 112. The second electrode 130 may include a plate-shaped electrode on a second side wall, e.g., a side wall of the electron beam chamber 112 that is opposite to the outlet 114 (e.g., an outer side wall of the electron beach chamber 112). For example, the second electrode 130 may be on a side wall of the electron beam chamber 112 that is adjacent and orthogonal to the side wall of the electron beam chamber 112 to which the first electrode 120 is adjacent.

A second power supply 160 may supply a source power as electron beam acceleration energy to the second electrode 130. The second power supply 160 may include a DC power supply. The coil of the first electrode 120 may be connected to the second power supply 160 to be grounded.

The guide 200 may be installed in the outlet 114 of the electron beam chamber 112. The guide 200 may include an insulation material. The guide 200 may include the slits 210 (or injection holes) through which the electron beams generated in the electron beam chamber 112 may be transmitted. The slits 210 may extend in a direction parallel with the upper surface of the substrate support 30 (e.g., a radial direction of the electron beam supply 100). The electron beam EB irradiated or passing through the slits 210 of the guide 200 may travel in the direction parallel with the upper surface of the substrate support 30.

A gas supply 140 may supply the gas into the electron beam chamber 112 through a gas passage 116. When the gas is supplied into the electron beam chamber 112 from the gas supply 140, the plasma source power may be applied to the first electrode 120 such that the gas is transformed into plasma. The source power as the electron beam acceleration energy may be applied to the second electrode 130 to transmit an electron beam from the plasma to the first plasma generation region P1 over the substrate support 30 through the guide 200 in the outlet 114.

In an implementation, the electron beam supply 100 may irradiate the electron beam EB to the first plasma generation region P1 over the substrate support 30 to convert the plasma (first plasma) generated from the gas supplied from the shower head 40 into a new plasma (second plasma). In an implementation, the first plasma may not be generated, and the electron beam supply 100 may convert gas supplied from the shower head 40 into plasma using the electron beam EB.

The first plasma may have a distribution of various electron temperatures, and the second plasma may have an electron temperature distribution of a narrow region, to thereby intensively generate dissociation in a specific region. The state of the species of radicals within the chamber 20 may be changed or the ratio of ions/radicals may be controlled.

The guide 200 may be installed in the outlet 114 of the electron beam supply 100 to separate the electron beam chamber 112 from the inner space of the chamber 20. The guide 200 may include the insulation material, rather than a conductive metal grid, and even when the electron beam EB passes through the slits 210 of the guide 200 and progresses over the substrate support 30, contamination within the chamber 20 (which could otherwise occur due to the metal grid) may be prevented.

As mentioned above, the plasma processing apparatus 10 may include the plasma generator (first plasma generation source) configured to generate the plasma over the substrate support 30 within the chamber 20 and the electron beam supply 100 (second plasma generation source) configured to inject the electron beam EB to the plasma generation region P1 over the substrate support 30. The electron beam supply 100 may include the side insulator 110 outside (e.g., around) the substrate support 30 and including the electron beam chamber 112 therein, the first electrode 120 having the coil configuration embedded in the side insulator 110, the second electrode 130 in the inner wall of the electron beam chamber 112, and the guide 200 in the outlet 114 of the electron beam chamber 112 and having the slits 210 therein.

In an implementation, the electron beam supply 100 may irradiate the electron beam EB to the first plasma generation region P1 over the substrate support 30 to convert the plasma (first plasma) generated from the gas supplied from the shower head 40 into new plasma (second plasma). In an implementation, the first plasma may not be generated, and the electron beam supply 100 may convert the gas supplied from the shower head 40 into plasma using the electron beam EB.

The second plasma may have an electron temperature distribution of a narrow region, to thereby intensively generate dissociation in a specific region. The state of the species of radicals within the chamber 20 may be changed or the ratio of ions/radicals may be controlled.

In an implementation, the guide 200 may include the insulation material, rather than, e.g., a conductive metal grid, and when the electron beam EB passes through the slits 210 of the guide 200 and progresses over the substrate support 30, contamination of the inner space of the chamber 20 due to the metal grid may be prevented.

Figure 5:
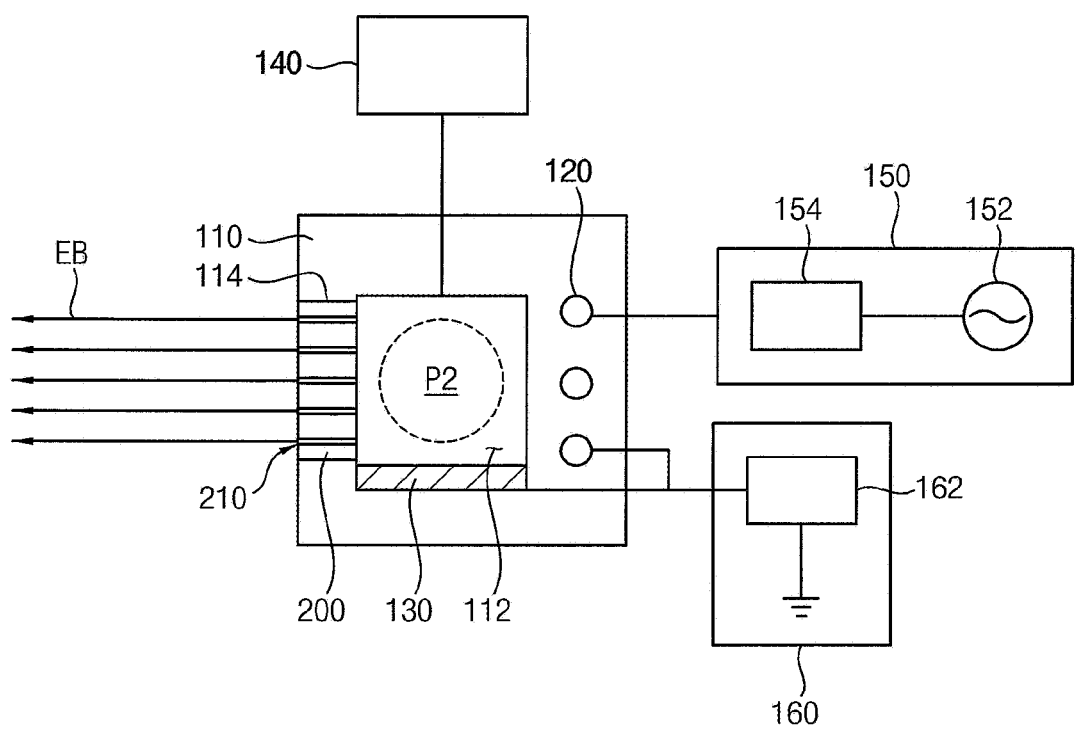
FIG. 5 illustrates a diagram of an electron beam generator of a plasma processing apparatus in accordance with example embodiments.

FIG. 5 illustrates a diagram of an electron beam generator of a plasma processing apparatus in accordance with example embodiments. The electron beam generator may be substantially the same as or similar to that of the plasma processing apparatus described with reference to FIGS. 1 to 4 except for the first and second electrodes. Thus, same reference numerals will be used to refer to the same or like elements and repeated explanation concerning the above elements may be omitted.

Referring to FIG. 5, a first electrode 120 may be adjacent to a first side wall, e.g., a side wall of the electron beam chamber 112 opposite to an outlet 114 (e.g., an outer side wall of the electron beam chamber 112). The first electrode 120 may be spaced from an inner wall of the electron beam chamber 112. The first electrode 120 may include at least portions of coils adjacent to an outer side wall of a side insulator 110 to extend along an extending (e.g., circumferential) direction of the side insulator 110 respectively. For example, the first electrode 120 may be between the outer side wall of the electron beam chamber 112 and the outer side wall of the side insulator 110.

A second electrode 130 may include a plate-shaped electrode on a second side wall, e.g., a bottom wall of the electron beam chamber 112. In an implementation, the second electrode 130 may be disposed on a top wall of the electron beam chamber 112.

Figure 6:
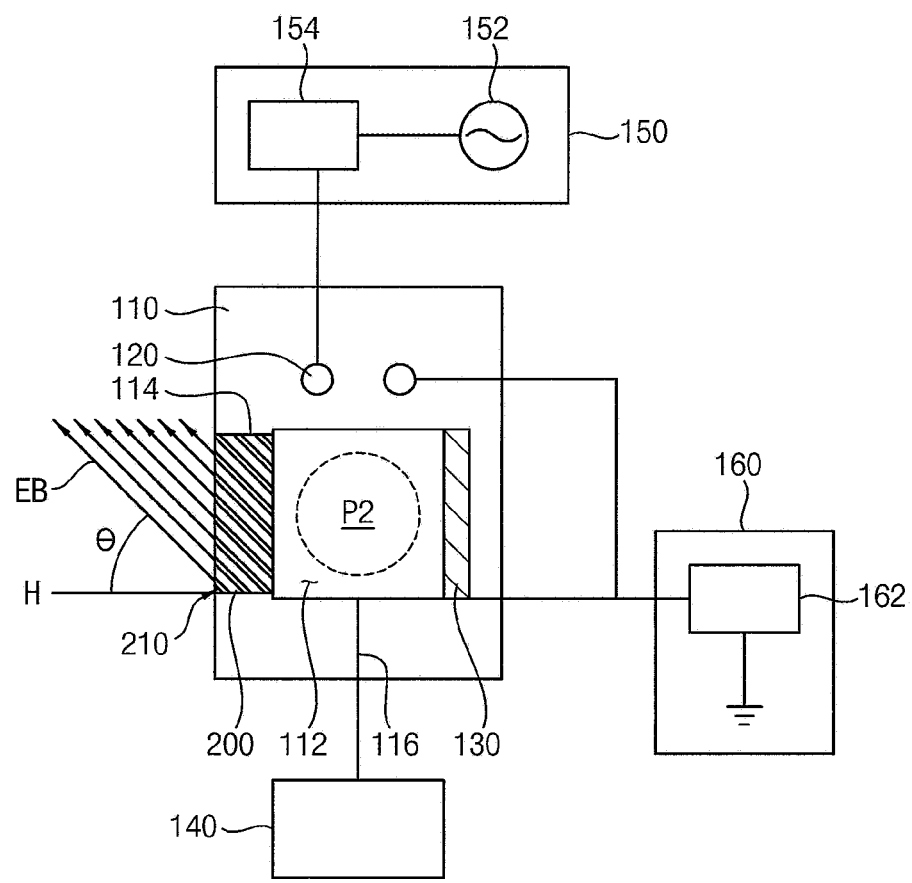
FIGS. 6 and 7 illustrate diagrams of an electron beam generator of a plasma processing apparatus in accordance with example embodiments.
Figure 7:
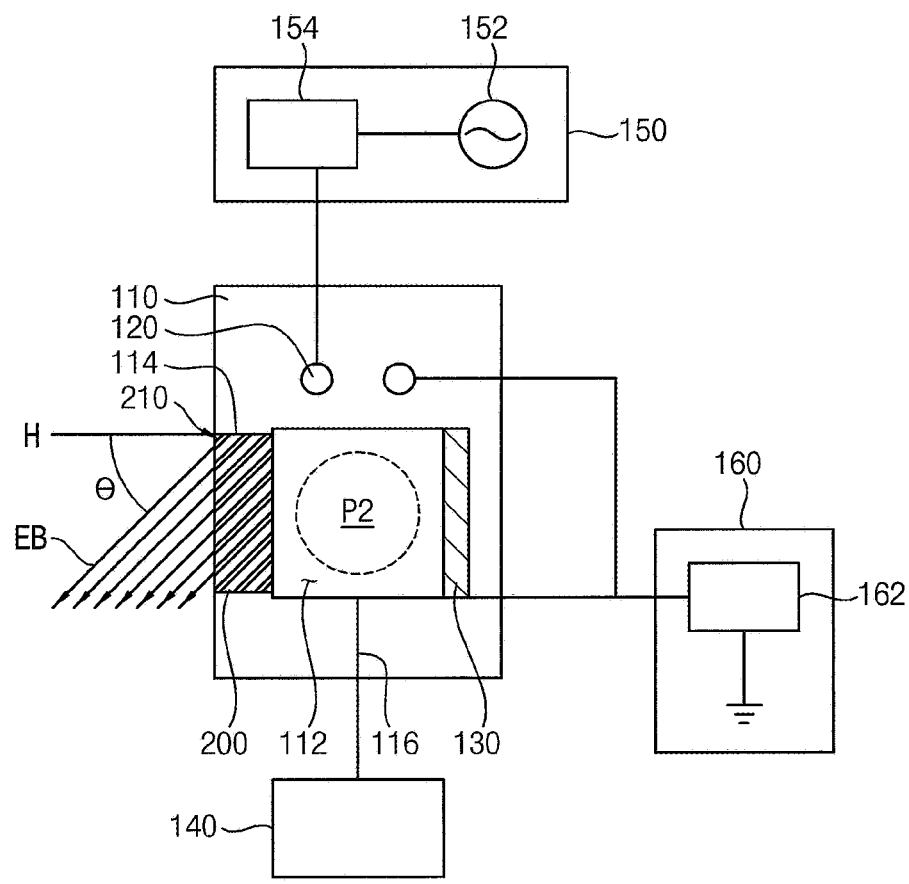

FIGS. 6 and 7 illustrate diagrams of an electron beam generator of a plasma processing apparatus in accordance with example embodiments. The electron beam generator may be substantially the same as or similar to that of the plasma processing apparatus described with reference to FIGS. 1 to 4 except for incident angles of slits of a guide. Thus, same reference numerals will be used to refer to the same or like elements and repeated explanation concerning the above elements may be omitted.

Referring to FIGS. 6 and 7, a slit 210 of a guide 200 may extend (e.g., through the outlet 114) in a direction inclined at a predetermined angle θ with respect to an upper surface of a substrate support 30. An electron beam EB irradiated through the slits 210 of the guide 200 may travel in the direction inclined at the predetermined angle with respect to the upper surface of the substrate support 30. An incident angle of the electron beam of an electron beam supply 100 into the chamber 20 may be adjusted.

As illustrated in FIG. 6, the slit 210 of the guide 200 may extend in the direction inclined at a predetermined angle with respect to an upper surface of a substrate support 30 to face or be emitted toward a shower head 40. In this case, the electron beam supply 100 may be installed to be positioned lower than the upper surface of the substrate support 30 (e.g., closer to a bottom of the chamber 20).

As illustrated in FIG. 7, the slit 210 of the guide 200 may extend in the direction inclined at a predetermined angle with respect to an upper surface of the substrate support 30 to face or be emitted toward the substrate support 30. In this case, the electron beam supply 100 may be installed to be positioned higher than the upper surface of the substrate support 30 (e.g., closer to the shower head 40).

Hereinafter, a method of processing a substrate using the plasma processing apparatus in FIG. 1 will be explained.

Figure 8:
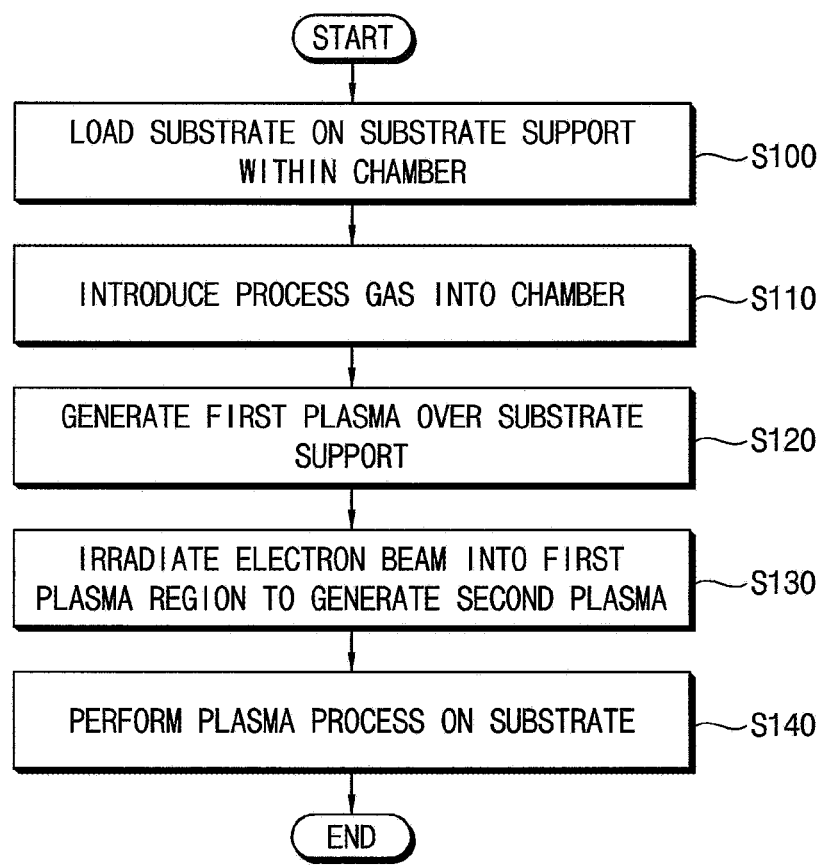
FIG. 8 illustrates a flow chart of a plasma processing method in accordance with example embodiments.

FIG. 8 illustrates a flow chart of a plasma processing method in accordance with example embodiments.

Referring to FIGS. 1 and 8, a substrate may be loaded into the chamber 20 (S100), and then, a process gas may be supplied through the shower head 40 (S110).

First, a semiconductor wafer W may be loaded on the substrate support 30 within the chamber 20. The process gas (e.g., an etching gas) may be introduced into the chamber 20 through the gas supply line 62 and then a pressure of the chamber 20 may be controlled to a desired vacuum level by an exhauster 26 connected to an exhaust port 24. The etching gases may be supplied to the chamber 20 through the gas supply line 62 and the shower head 40.

The gas may be introduced to the gas diffusion room 41 of the shower head 40 connected to the gas supply line 62, and the introduced gas may be supplied through injection holes 45 of the shower head 40.

Then, a sinusoidal wave power may be applied to an upper electrode 50 to generate a first plasma in the first plasma generation region P1 on the substrate support 30 within the chamber 20 (S120), an electron beam EB may be irradiated to the first plasma generation region P1 to generate a second plasma (S130), and then, an etching process or a deposition process may be performed on an object layer on the wafer W (S140). In an implementation, the power may not be applied to the upper electrode 50, and the electron beam EB may be used to convert the supplied process gas into plasma to perform a plasma process.

The plasma power supply 70 may apply a sinusoidal wave power signal to the upper electrode 50 and a bias power supply 80 may apply a bias power signal to the lower electrode 32, to generate the first plasma over the substrate support 30 within the chamber 20.

Then, an electron beam supply 100 may generate an electron beam EB and irradiate the generated electron beam EB to the first plasma generation region P1 over the substrate support 30. The electron beam supply 100 may irradiate the electron beam EB to the first plasma generation region P1 over the substrate support 30 to convert the plasma (first plasma) generated from the gas supplied from the shower head 40 into new plasma (second plasma).

The second plasma may have an electron temperature distribution of a narrow region, to thereby intensively generate dissociation in a specific region. The state of the species of radicals within the chamber 20 may be changed or the ratio of ions/radicals may be controlled.

Through the characteristics of the electron beam plasma having an electron temperature of a specific region, selective dissociation of gas in the chamber may be enabled, and damage due to low electron temperature in the plasma process may be minimized.

The above plasma processing apparatus and plasma process method may be used to manufacture semiconductor devices including logic devices and memory devices. For example, the semiconductor device may be applied to logic devices such as central processing units (CPUs), main processing units (MPUs), or application processors (APs), or the like, and volatile memory devices such as DRAM devices, SRAM devices, or non-volatile memory devices such as flash memory devices, PRAM devices, MRAM devices, ReRAM devices, or the like.

A semiconductor device manufactured by a plasma processing apparatus and a plasma processing method in accordance with example embodiments may be used in various systems such as a computing system. The semiconductor device may include finFET, DRAM, VAND, or the like. The system may be applied to a computer, a portable computer, a laptop computer, a personal portable terminal, a tablet, a cell phone, a digital music player, or the like.

By way of summation and review, plasma generated by some plasma etching apparatuses may have an electron temperature distribution of a wide region, and process by-products may be generated or damage to a structure could occur due to undesired reaction.

One or more embodiments may provide an electron beam generator of a plasma processing apparatus.

One or more embodiments may provide an electron beam generator capable of providing an electron temperature distribution of a desired region.

According to example embodiments, a plasma processing apparatus may include a plasma generator (first plasma generation source) configured to generate plasma over a substrate support within a chamber and an electron beam generator (second plasma generation source) configured to inject an electron beam to a plasma generation region over the substrate support.

The electron beam generator may irradiate the electron beam to the plasma generation region over the substrate support to convert the plasma (first plasma) generated from a gas supplied from a shower head into new plasma (second plasma). Alternatively, while the first plasma is not generated, the electron beam generator may convert the gas supplied from the shower head into plasma using the electron beam.

The second plasma may have an electron temperature distribution of a narrow region, to thereby intensively generate dissociation in a specific region. The state of the species of radicals within the chamber may be changed or the ratio of ions/radicals may be controlled.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An electron beam generator for a plasma processing apparatus that includes a substrate support within a process chamber, the electron beam generator comprising:
a side insulator configured to surround the substrate support, the side insulator having an annular shape extending along a circumferential direction about a center of the chamber, the side insulator having a plurality of electron beam chambers therein, the plurality of electron beam chambers being arranged along the extending direction of the side insulator to be spaced apart from each other, each of the electron beam chambers having an outlet which is open toward the substrate support;
a first electrode embedded in the side insulator and adjacent to a first side wall of each of the electron beam chambers;
a second electrode on a second side wall of each of the electron beam chambers; and
a guide in the outlet of each of the electron beam chambers, the guide including slits through which electron beams generated in the electron beam chamber are transmittable into the process chamber,
wherein:
at least one coil is embedded in the side insulator and extends in a same direction as the extending direction of the side insulator,
the first electrode includes at least a portion of the at least one coil and the second electrode include a plate-shaped electrode on the second side wall of the electron beam chamber, and
the guide includes an insulation material.

2. The electron beam generator as claimed in claim 1, wherein:
the side insulator includes an insulation material, and
the guide does not include a conductive metal grid.

3. The electron beam generator as claimed in claim 2, wherein the side insulator includes a ceramic material.

4. The electron beam generator as claimed in claim 1, wherein the slits extend in a direction parallel with an upper surface of the substrate support.

5. The electron beam generator as claimed in claim 1, wherein the slits extend in a direction inclined at a predetermined angle with respect to an upper surface of the substrate support.

6. The electron beam generator as claimed in claim 1, wherein:
the first side wall of the electron beam chamber is a top wall of the electron beam chamber, and
the second side wall of the electron beam chamber is an outer side wall of the electron beam chamber opposite to the outlet.

7. The electron beam generator as claimed in claim 1, wherein:
the first side wall of the electron beam chamber is an outer side wall of the electron beam chamber opposite to the outlet, and
the second side wall of the electron beam chamber is a bottom wall of the electron beam chamber.

8. The electron beam generator as claimed in claim 1, further comprising:
a first power supply configured to apply a plasma source power to the first electrode; and
a second power supply configured to apply electron beam acceleration energy to the second electrode.

9. The electron beam generator as claimed in claim 1, further comprising a gas supply configured to supply a gas into the electron beam chamber.

10. A plasma processing apparatus, comprising:
a process chamber providing a space for processing a substrate;
a substrate support configured to support the substrate within the process chamber;
a shower head within the process chamber to face the substrate, the shower head being configured to supply a gas toward the substrate;
a plasma generator configured to convert the gas into plasma over the substrate support; and
an electron beam supply outside the substrate support and configured to inject an electron beam to a region of the plasma,
wherein the electron beam supply includes:
a side insulator outside the substrate support, having an annular shape extending along a circumferential direction about a center of the chamber, and having a plurality of electron beam chambers therein, the plurality of electron beam chambers being arranged along the extending direction of the side insulator to be spaced apart from each other, each of the electron beam chambers having an outlet which is open toward the substrate support;
a first electrode embedded in the side insulator and adjacent to a first side wall of each of the electron beam chambers;
a second electrode on a second side wall of each of the electron beam chambers; and
a guide in the outlet of each of the electron beam chambers, the guide including slits through which electron beams generated in the electron beam chamber are transmittable into the process chamber,
wherein at least one coil is embedded in the side insulator and extends in a same direction as the extending direction of the side insulator,
wherein the first electrode includes at least a portion of the at least one coil and the second electrode include a plate-shaped electrode on the second side wall of the electron beam chamber, and
wherein the guide includes an insulation material.

11. The plasma processing apparatus as claimed in claim 10, wherein:
the side insulator includes an insulation material, and
the guide does not include a conductive metal grid.

12. The plasma processing apparatus as claimed in claim 11, wherein the side insulator includes a ceramic material.

13. The plasma processing apparatus as claimed in claim 10, wherein the slits extend in a direction parallel with an upper surface of the substrate support.

14. The plasma processing apparatus as claimed in claim 10, wherein the slits extend in a direction inclined at a predetermined angle with respect to an upper surface of the substrate support.

15. The plasma processing apparatus as claimed in claim 10, wherein:
the first side wall of the electron beam chamber is a top wall of the electron beam chamber, and
the second side wall of the electron beam chamber is an outer side wall of the electron beam chamber opposite to the outlet.

16. The plasma processing apparatus as claimed in claim 10, wherein:
the first side wall of the electron beam chamber is an outer side wall of the electron beam chamber opposite to the outlet, and
the second side wall of the electron beam chamber is a bottom wall of the electron beam chamber.

17. The plasma processing apparatus as claimed in claim 10, wherein the side insulator of the electron beam supply is installed detachably on a lower portion of the shower head.

* * * * *